United States Patent
Anderson et al.

(10) Patent No.: US 8,518,611 B2
(45) Date of Patent: Aug. 27, 2013

(54) MULTIPLE LITHOGRAPHIC SYSTEM MASK SHAPE SLEEVING

(75) Inventors: Brent A. Anderson, Jericho, VT (US);
Jeb H. Rankin, Richmond, VT (US);
Adam C. Smith, Colchester, VT (US)

(73) Assignee: International Business Machines Corporation, Armonk, NY (US)

( * ) Notice: Subject to any disclaimer, the term of this patent is extended or adjusted under 35 U.S.C. 154(b) by 162 days.

(21) Appl. No.: 13/007,242

(22) Filed: Jan. 14, 2011

(65) Prior Publication Data

US 2012/0183889 A1    Jul. 19, 2012

(51) Int. Cl.
*G03F 1/68* (2012.01)

(52) U.S. Cl.
USPC .............................................. 430/5; 430/394

(58) Field of Classification Search
USPC ................. 430/5, 322, 323, 394; 355/53, 77
See application file for complete search history.

(56) References Cited

U.S. PATENT DOCUMENTS

| | | | |
|---|---|---|---|
| 6,281,965 B1 * | 8/2001 | Nakashima | 355/53 |
| 6,635,549 B2 * | 10/2003 | Kyoh et al. | 430/5 |
| 7,296,245 B2 | 11/2007 | Lin | |
| 7,629,087 B2 * | 12/2009 | Huh et al. | 430/5 |
| 2002/0160628 A1 | 10/2002 | Okoroanyanwu et al. | |

OTHER PUBLICATIONS

Kaszuba et al., "Complementary Selective Writing by Direct-Write E-Beam/Optical Lithography Using Mixed Positive and Negative Resist"; ip.comn; N3A;8/90; pp. 62-63 (Mar. 16, 2005).

* cited by examiner

*Primary Examiner* — Stephen Rosasco
(74) *Attorney, Agent, or Firm* — Cantor Colburn LLP; Richard Kotulak

(57) ABSTRACT

A mask fabrication method can include receiving a mask design, sending first exposure parameters to a first exposure machine, sending second exposure parameters to a second exposure machine, sending a first exposure generation command to the first machine based on the first exposure parameters and sending a second exposure generation command to the second machine based on the second exposure parameters.

20 Claims, 4 Drawing Sheets

MULTIPLE LITHOGRAPHIC SYSTEM MASK SHAPE SLEEVING

BACKGROUND

The present invention relates to photomask lithography, and more specifically, to systems and methods for sleeving of mask shapes implementing multiple lithographic systems.

In photolithography, masks are implemented to pattern devices on semiconductor wafers. Masks are fabricated to define patterns for the devices. Masks are typically fabricated by forming blanks with a patterned opaque film. For example, quartz blanks can be coated with a suitable opaque film such as chrome or molybdenum-silicide (MoSi). Photoresist is implemented to pattern the opaque film and currently, electron-beam (e-beam) writers are implemented to expose the resist to form the patterns. Prior to the advent of e-beam writers, optical writers were implemented and typically operated lower current density and higher wavelengths, such as 256-365 nm. For the lithographic step of transferring these mask patterns to wafers, the accuracy and crispness of outer edges of the shapes on the masks are important because the outer edges define the edges of shapes transferred from the masks to the wafers. Center regions typically function to block light, but the edges define size, and thus influence size control of the device features. The cost of e-beam writer is proportional to the time it is implemented. Write times for entire masks can be six to twenty four hours. Therefore, the longer the e-beam writer is used, the more expensive the costs of the masks. What is needed is a system and method to reduce the time needed to use e-beam writers for patterning photomasks while maintaining the size control and other critical dimensions of masks.

SUMMARY

Exemplary embodiments include a mask fabrication method, including receiving a mask design, sending first exposure parameters to a first exposure machine, sending second exposure parameters to a second exposure machine, sending a first exposure generation command to the first machine based on the first exposure parameters and sending a second exposure generation command to the second machine based on the second exposure parameters.

Additional exemplary embodiments include a computer program product including a non-transitory computer readable medium having instructions for causing a computer to implement a mask fabrication method, including receiving a mask design, sending first exposure parameters to a first exposure machine, sending second exposure parameters to a second exposure machine, sending a first exposure generation command to the first machine based on the first exposure parameters and sending a second exposure generation command to the second machine based on the second exposure parameters.

Further exemplary embodiments include a mask fabrication system including a processor configured to receive a mask design, send first exposure parameters to a first exposure machine, send second exposure parameters to a second exposure machine, send a first exposure generation command to the first machine based on the first exposure parameters and send a second exposure generation command to the second machine based on the second exposure parameters.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Exemplary embodiments include systems and methods in which photomask blanks are patterned (i.e., sleeved) implementing mixed lithographic and e-beam imaging, thereby decreasing the times more costly e-beam writers are implemented. Once a mask blank is treated with photoresist, the mask blank is subject to multiple mask steps and exposures with different types of imaging equipment. In exemplary embodiments, less critical images in the center are imaged optically, while more critical imaging on the periphery of the mask feature (e.g., trimming edges) are imaged implementing e-beam exposure. It will be appreciate that the masks described herein include many features. As such, the exemplary methods described herein are performed on a feature by feature basis.

Figure 1:
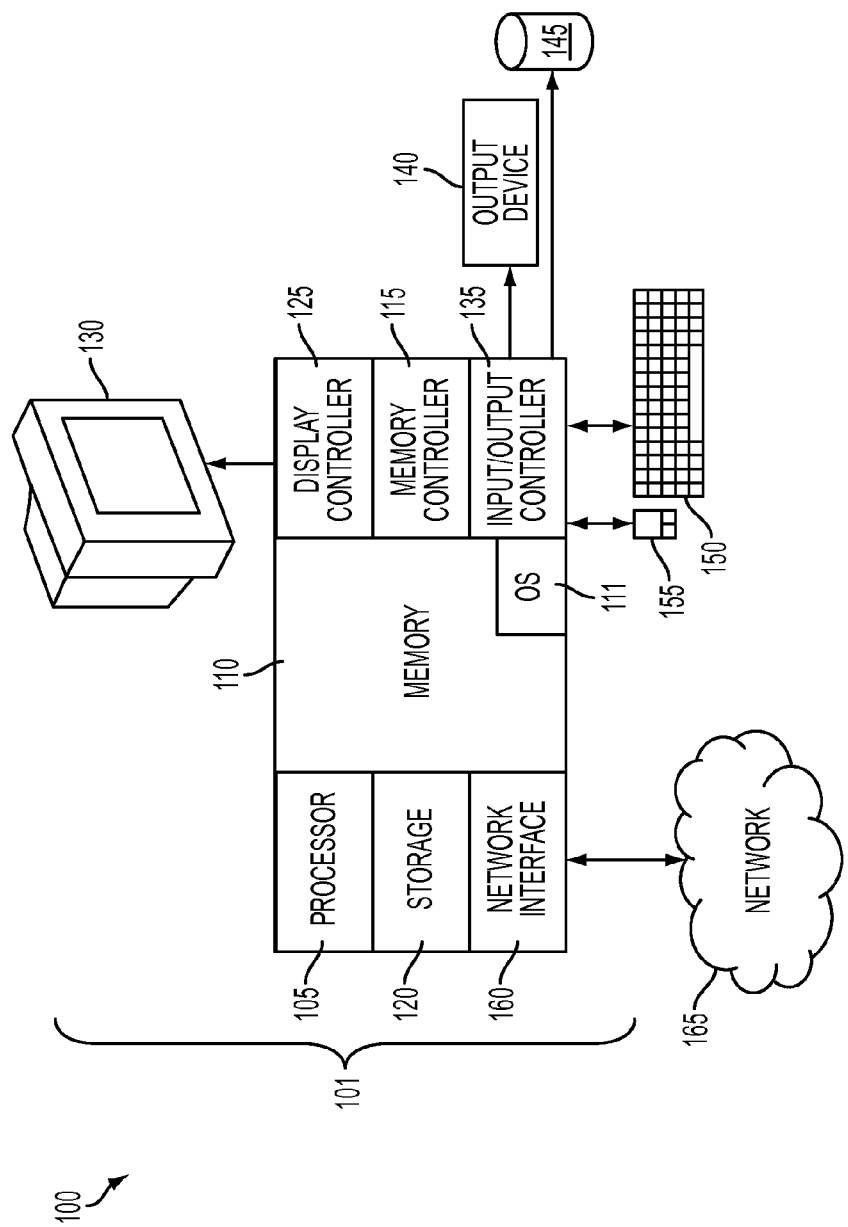
FIG. 1 illustrates an exemplary embodiment of a system for patterning mask shapes with multiple lithographic systems.

Any suitable computing system can be implemented to store and process mask designs and provide instructions to the photolithography equipment to expose the masks. FIG. 1 illustrates an exemplary embodiment of a system 100 for patterning mask shapes with multiple lithographic systems. The methods described herein can be implemented in software (e.g., firmware), hardware, or a combination thereof. In exemplary embodiments, the methods described herein are implemented in software, as an executable program, and is executed by a special or general-purpose digital computer, such as a personal computer, workstation, minicomputer, or mainframe computer. The system 100 therefore includes general-purpose computer 101.

In exemplary embodiments, in terms of hardware architecture, as shown in FIG. 1, the computer 101 includes a processor 105, memory 110 coupled to a memory controller 115, and one or more input and/or output (I/O) devices 140, 145 (or peripherals) that are communicatively coupled via a local input/output controller 135. The input/output controller 135 can be, but is not limited to, one or more buses or other wired or wireless connections, as is known in the art. The input/output controller 135 may have additional elements, which are omitted for simplicity, such as controllers, buffers (caches), drivers, repeaters, and receivers, to enable communications. Further, the local interface may include address, control, and/or data connections to enable appropriate communications among the aforementioned components.

The processor 105 is a hardware device for executing software, particularly that stored in memory 110. The processor 105 can be any custom made or commercially available processor, a central processing unit (CPU), an auxiliary processor among several processors associated with the computer 101, a semiconductor based microprocessor (in the form of a microchip or chip set), a macroprocessor, or generally any device for executing software instructions.

The memory 110 can include any one or combination of volatile memory elements (e.g., random access memory (RAM, such as DRAM, SRAM, SDRAM, etc.)) and nonvolatile memory elements (e.g., ROM, erasable programmable read only memory (EPROM), electronically erasable programmable read only memory (EEPROM), programmable read only memory (PROM), tape, compact disc read only memory (CD-ROM), disk, diskette, cartridge, cassette or the like, etc.). Moreover, the memory 110 may incorporate electronic, magnetic, optical, and/or other types of storage media. Note that the memory 110 can have a distributed architecture, where various components are situated remote from one another, but can be accessed by the processor 105.

The software in memory 110 may include one or more separate programs, each of which comprises an ordered listing of executable instructions for implementing logical functions. In the example of FIG. 1, the software in the memory 110 includes the multiple-lithographic system patterning methods described herein in accordance with exemplary embodiments and a suitable operating system (OS) 111. The OS 111 essentially controls the execution of other computer programs, such the multiple-lithographic system patterning systems and methods as described herein, and provides scheduling, input-output control, file and data management, memory management, and communication control and related services.

The multiple-lithographic system patterning methods described herein may be in the form of a source program, executable program (object code), script, or any other entity comprising a set of instructions to be performed. When a source program, then the program needs to be translated via a compiler, assembler, interpreter, or the like, which may or may not be included within the memory 110, so as to operate properly in connection with the OS 111. Furthermore, the multiple-lithographic system patterning methods can be written as an object oriented programming language, which has classes of data and methods, or a procedure programming language, which has routines, subroutines, and/or functions.

In exemplary embodiments, a conventional keyboard 150 and mouse 155 can be coupled to the input/output controller 135. Other output devices such as the I/O devices 140, 145 may include input devices, for example but not limited to a printer, a scanner, microphone, and the like. The I/O devices 140, 145 may further include devices that communicate both inputs and outputs, for instance but not limited to, a network interface card (NIC) or modulator/demodulator (for accessing other files, devices, systems, or a network), a radio frequency (RF) or other transceiver, a telephonic interface, a bridge, a router, and the like. Finally, the I/O devices 140, 145 can be any suitable photolithographic equipment described herein. For example, the I/O devices 140, 145 can be an e-beam writer for exposing periphery images on masks. The I/O devices 140, 145 can also be optical imaging equipment for exposing the less-critical center dimensions of the mask. The system 100 can further include a display controller 125 coupled to a display 130. In exemplary embodiments, the system 100 can further include a network interface 160 for coupling to a network 165. The network 165 can be an IP-based network for communication between the computer 101 and any external server, client and the like via a broadband connection. The network 165 transmits and receives data between the computer 101 and external systems. In exemplary embodiments, network 165 can be a managed IP network administered by a service provider. The network 165 may be implemented in a wireless fashion, e.g., using wireless protocols and technologies, such as WiFi, WiMax, etc. The network 165 can also be a packet-switched network such as a local area network, wide area network, metropolitan area network, Internet network, or other similar type of network environment. The network 165 may be a fixed wireless network, a wireless local area network (LAN), a wireless wide area network (WAN) a personal area network (PAN), a virtual private network (VPN), intranet or other suitable network system and includes equipment for receiving and transmitting signals.

If the computer 101 is a PC, workstation, intelligent device or the like, the software in the memory 110 may further include a basic input output system (BIOS) (omitted for simplicity). The BIOS is a set of essential software routines that initialize and test hardware at startup, start the OS 111, and support the transfer of data among the hardware devices. The BIOS is stored in ROM so that the BIOS can be executed when the computer 101 is activated.

When the computer 101 is in operation, the processor 105 is configured to execute software stored within the memory 110, to communicate data to and from the memory 110, and to generally control operations of the computer 101 pursuant to the software. The multiple-lithographic system patterning methods described herein and the OS 111, in whole or in part, but typically the latter, are read by the processor 105, perhaps buffered within the processor 105, and then executed.

When the systems and methods described herein are implemented in software, as is shown in FIG. 1, the methods can be stored on any computer readable medium, such as storage 120, for use by or in connection with any computer related system or method.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing.

In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In exemplary embodiments, where the multiple-lithographic system patterning methods are implemented in hardware, the multiple-lithographic system patterning methods described herein can implemented with any or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

Figure 2:
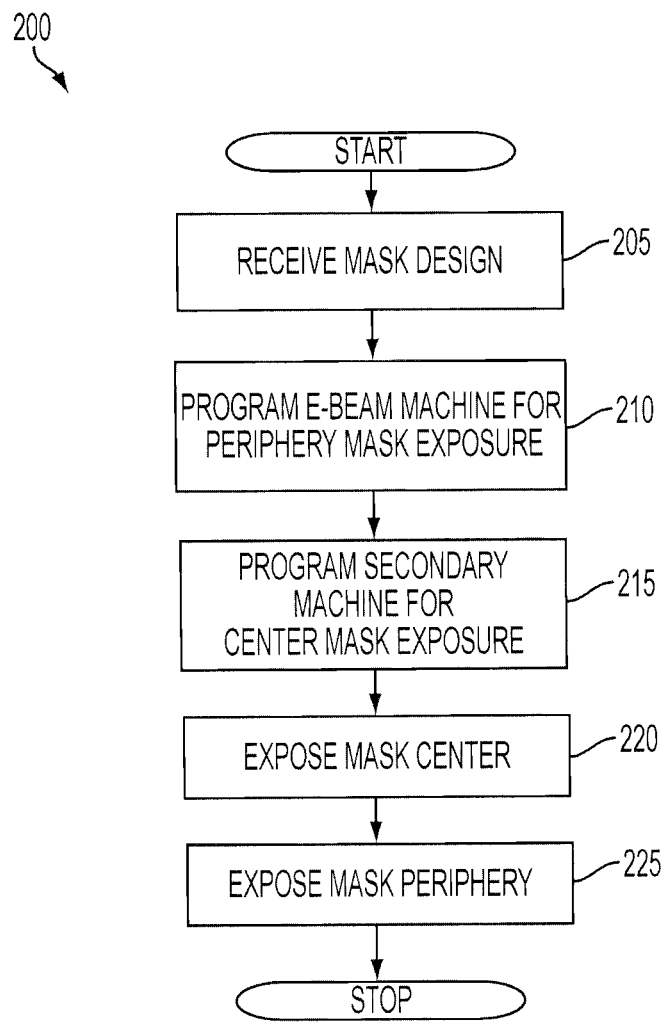
FIG. 2 illustrates a flowchart of a method for patterning mask shapes with multiple lithographic systems in accordance with exemplary embodiments.
Figure 3A:
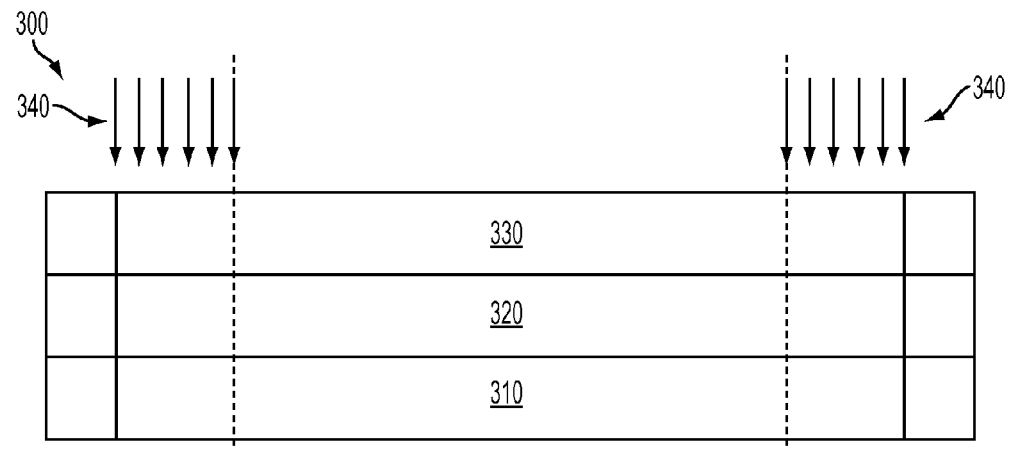
FIG. 3, including FIGS. 3A-3C taken together, illustrates a side view of an exemplary mask blank.
Figure 3B:
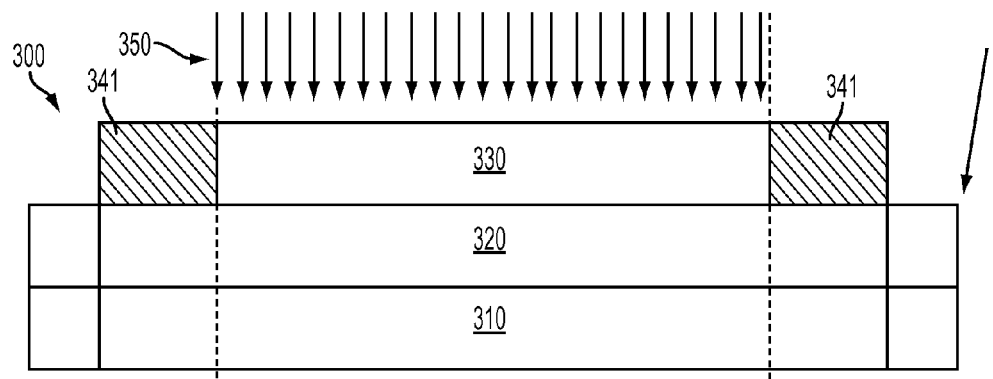
Figure 3C:
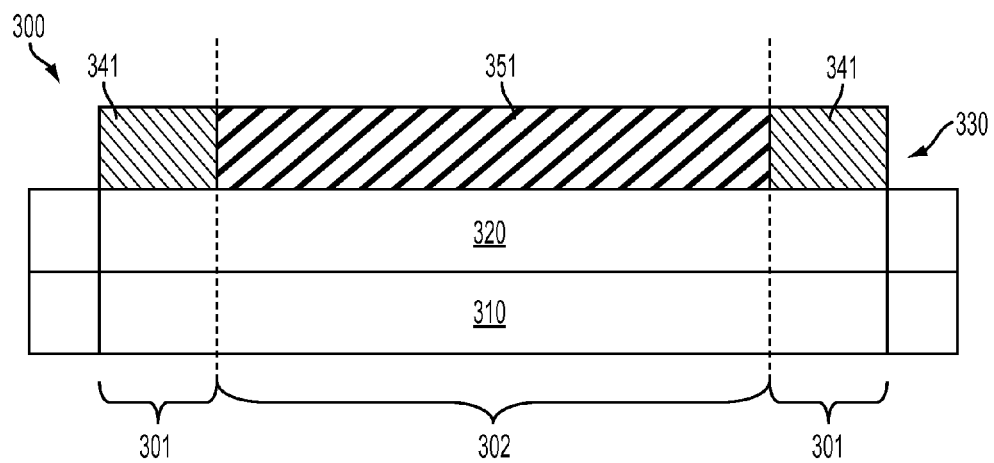

FIG. 2 illustrates a flowchart of a method 200 for patterning mask shapes with multiple lithographic systems in accordance with exemplary embodiments. As described herein, any suitable computing system, such as the system 100, can be implemented to store and process mask designs and provide instructions to the photolithography equipment to expose the mask blanks. FIG. 3 illustrates side views of an exemplary mask blank 300. The mask blank 300 can include a substrate 310 (e.g., quartz), and an opaque layer 320 (such as chrome, MoSi or other suitable opaque or semi-opaque material). FIG. 3 further illustrates a photoresist layer 330. The mask blank is shown with an identified periphery region 301 and center region 302. The method 200 presupposes that a mask blank 300 is properly prepared. As such, the opaque layer 320 is covered in the photoresist layer 330 (e.g., positive or negative), selected appropriately for patterning the mask blank 300 implementation. As further described herein, any suitable photoresist can be implemented. In exemplary embodiments, chemically amplified photoresist can be implemented because, chemically amplified photoresist has a high tolerance to wait times between exposures. As described herein, there is a finite wait time between multiple exposures. It will be appreciated that the finite wait time is not long enough to affect photoresist reaction. However, chemically amplified photoresist is resilient to low temperature times delays. In exemplary embodiments, the systems and methods described herein operate within controlled and known time gaps between exposures so that any effects of the delay can be calculated. In photoresists, electrons are generated after exposure. As such, the time delays are not as critical. It is appreciated by those skilled in the art that there is always some electron diffusion after exposure, so it is desirable to keep the delay as low as possible between exposures. In exemplary embodiments, a single layer of photoresist is implemented for the multiple exposures. In exemplary embodiments, any suitable photoresistive material that is sensitive to the wavelengths of the multiple exposure systems can be implemented.

Referring still to FIG. 1, at block 205, the system 100 can receive the mask design, which will be transferred to the mask blank 300 and can include both the patterns for the periphery of the mask blank and the center of the mask blank. It will also be appreciated that patterning-masks are implemented to expose patterns into the photoresist of the mask blank 300. At block 210, the system 100 can program (i.e., provide instructions or exposure parameters) to the e-beam machine to expose the periphery region 301 of the mask blank 300. At block 215, the system 100 can program (i.e., provide instructions or exposure parameters) to the secondary machine(s) (e.g., optical lithography machines as described herein) to expose the center region 302 of the mask blank 300. It will be appreciated that the order in which the system 100 is programmed is not necessarily critical as there are no times delays for exposed photoresist at the point of programming. At block 220, the system 100 can then instruct (i.e., generate an exposure command to) the secondary machine to expose the center region 302 of the mask blank 300 with optical radiation 340. At block 225, the system 100 can then instruct (i.e., generate an exposure command to) the e-beam machine to expose the periphery region 302 of the mask blank 300 with e-beam radiation 350. FIG. 3 illustrates exposed regions 341, 351 to differentiate how the exposed regions 341, 351 are exposed by different radiation. Between exposures at blocks 220, 225, there is a time delay to change between the e-beam writer and the secondary machines. In addition, there may be a time delay if the patterning masks are different for the center and periphery regions 301, 302 of the mask blank 300. As described above, the order of the programming of the multiple machines is not critical. In exemplary embodiments, although it is contemplated that the order of exposure of the center and periphery regions 301, 302 can be switched, it is desirable to expose the center region 302 of the mask blank first so that there is a shorter and more defined delay between exposing the edges and subsequent etching of the mask patterns as now described.

In exemplary embodiments, after the exposures of block 220, 225, the exposed (or unexposed) photoresist is developed (i.e., non-crosslinked portions are removed with a solvent), which exposes the mask-blank substrate. The mask blank is then subjected to an etch (e.g., wet, or Reactive Ion Etching (RIE)), which removes the mask opaque layers. The photoresist is then removed (via another solvent), and the resultant mask blank has a pattern of the opaque where the photoresist was originally exposed.

Figure 5:
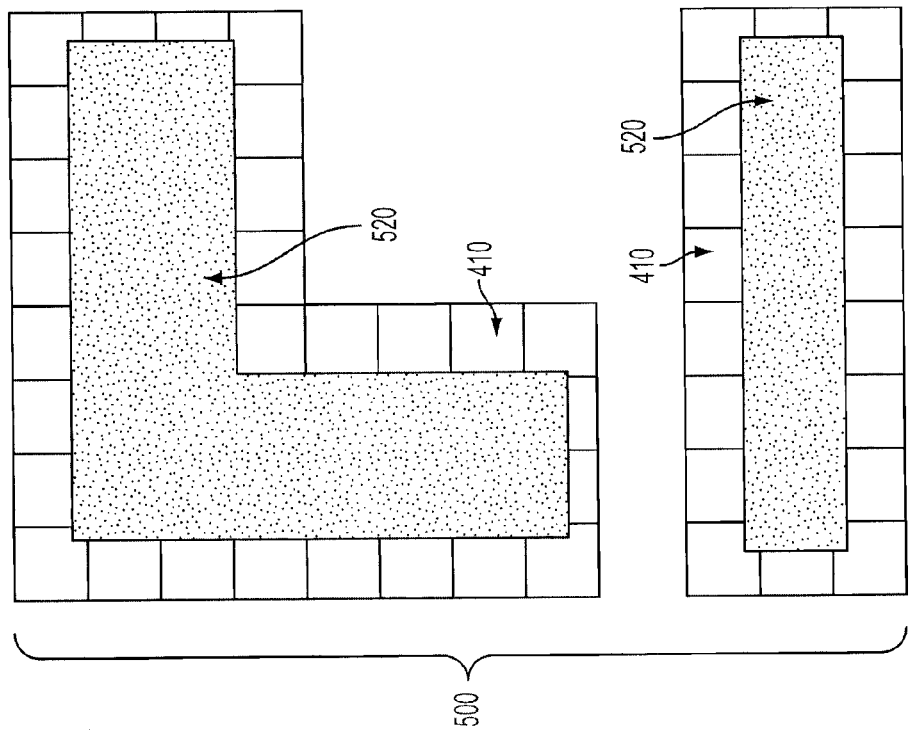
FIG. 5 illustrates a top plan view of an example of a mask blank and corresponding e-beam and optical exposure shots exposed in accordance with exemplary embodiments.
Figure 4:
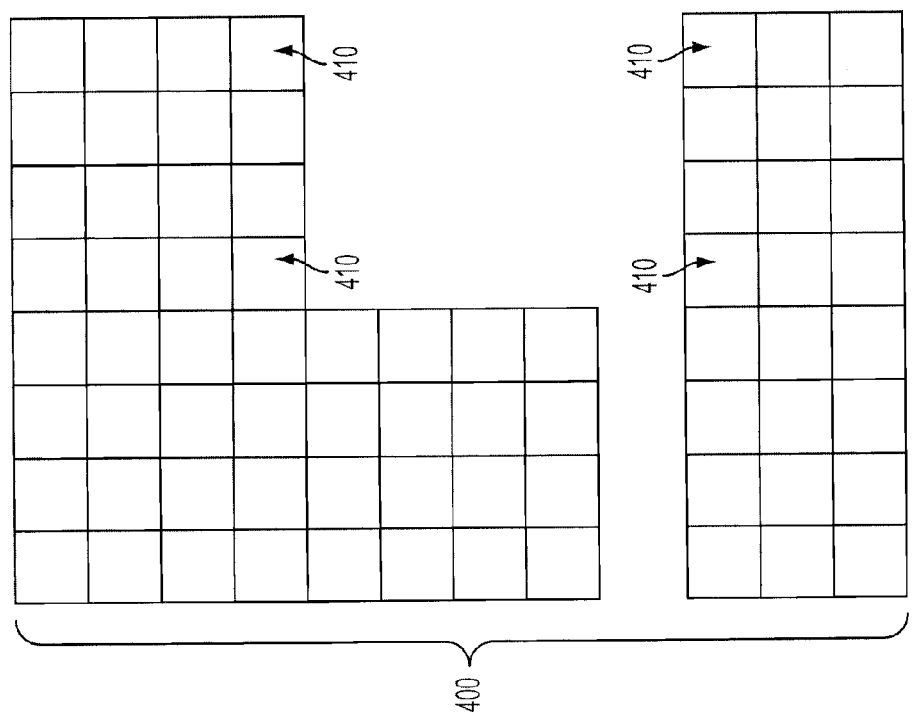
FIG. 4 illustrates a top plan view of a prior art example of a mask blank and corresponding e-beam exposure shots.

FIG. 4 illustrates a prior art example of a mask blank 400 with e-beam shots, each illustrated as squares 410. It is appreciated that the squares 410 are shown for illustrative purposes, and that actual patterns may be more complex. Each square is shown to illustrate that the e-beam can be implemented, in this example, for seventy two shots to achieve the pattern shown in the example. In contrast, FIG. 5 illustrates an example of an exemplary mask blank 500 in which the center region 520 is exposed with secondary machines, leaving much fewer squares 510, in this example 46 shots, from the e-beam writer. FIG. 5 further illustrates that it is desirable to have the exposed periphery and center regions overlap to prevent any gaps between the regions. FIGS. 4 and 5 illustrate the reduction of implementation of a more costly e-beam writer to achieve the same quality mask as compared to the prior art.

Technical effects include the decrease of implementation of costly e-beam writers while maintaining high quality mask patterns. Technical effects further include implementation of underutilized photolithography optical equipment.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A mask fabrication method, comprising:
  receiving a mask design having at least one mask feature;
  sending first exposure parameters to a first exposure machine, the first exposure parameters for patterning a center region of the at least one mask feature;
  sending second exposure parameters to a second exposure machine, the second exposure parameters for patterning a periphery region of the at least one mask feature, the center and periphery regions being different exposure areas as defined by the first and second exposure parameters;
  sending a first exposure generation command to the first machine based on the first exposure parameters; and
  sending a second exposure generation command to the second machine based on the second exposure parameters.

2. The method as claimed in claim 1 wherein the first exposure generation command is a command to expose a first type of radiation onto a photoresist layer of a mask blank.

3. The method as claimed in claim 2 wherein the second exposure generation command is a command to expose a second type of radiation onto the photoresist layer of the mask blank.

4. The method as claimed in claim 3 wherein the first type of radiation is generated on the center region of the mask blank.

5. The method as claimed in claim 4 wherein the second type of radiation is generated on the periphery region of the mask blank.

6. The method as claimed in claim 3 wherein the first type of radiation is optical radiation generated on a center region of the mask blank.

7. The method as claimed in claim 6 wherein the second type of radiation is electron-beam radiation generated on a periphery region of the mask blank.

8. A computer program product including a non-transitory computer readable medium having instructions for causing a computer to implement a mask fabrication method, comprising:
   receiving a mask design having at least one mask feature;
   sending first exposure parameters to a first exposure machine, the first exposure parameters for patterning a center region of the at least one mask feature;
   sending second exposure parameters to a second exposure machine, the second exposure parameters for patterning a periphery region of the at least one mask feature, the center and periphery regions being different exposure areas as defined by the first and second exposure parameters;
   sending a first exposure generation command to the first machine based on the first exposure parameters; and
   sending a second exposure generation command to the second machine based on the second exposure parameters.

9. The computer program product as claimed in claim 8 wherein the first exposure generation command is a command to expose a first type of radiation onto a photoresist layer of a mask blank.

10. The computer program product as claimed in claim 9 wherein the second exposure generation command is a command to expose a second type of radiation onto the photoresist layer of the mask blank.

11. The computer program product as claimed in claim 10 wherein the first type of radiation is generated on the center region of the mask blank.

12. The computer program product as claimed in claim 11 wherein the second type of radiation is generated on the periphery region of the mask blank.

13. The computer program product as claimed in claim 10 wherein the first type of radiation is optical radiation generated on a center region of the mask blank.

14. The computer program product as claimed in claim 13 wherein the second type of radiation is electron-beam radiation generated on a periphery region of the mask blank.

15. A mask fabrication system comprising:
   a processor configured to:
   receive a mask design having at least one mask feature;
   send first exposure parameters to a first exposure machine, the first exposure parameters for patterning a center region of the at least one mask feature;
   send second exposure parameters to a second exposure machine, the second exposure parameters for patterning a periphery region of the at least one mask feature, the center and periphery regions being different exposure areas as defined by the first and second exposure parameters;
   send a first exposure generation command to the first machine based on the first exposure parameters; and
   send a second exposure generation command to the second machine based on the second exposure parameters.

16. The system as claimed in claim 15 wherein the first exposure machine is an optical radiation machine.

17. The system as claimed in claim 16 wherein the second exposure machine is an electron beam machine.

18. The system as claimed in claim 15 wherein the first exposure generation command is a command to expose a first type of radiation onto a photoresist layer of a mask blank.

19. The system as claimed in claim 18 wherein the second exposure generation command is a command to expose a second type of radiation onto the photoresist layer of the mask blank.

20. The system as claimed in claim 17 wherein the first type of radiation is optical radiation generated on the center region of the mask blank and the second type of radiation is electron-beam radiation generated on the periphery region of the mask blank.

* * * * *